(12) United States Patent
Enkisch et al.

(10) Patent No.: US 12,406,777 B2
(45) Date of Patent: Sep. 2, 2025

(54) OPTICAL ELEMENT FOR A EUV PROJECTION EXPOSURE SYSTEM

(71) Applicant: Carl Zeiss SMT GmbH, Oberkochen (DE)

(72) Inventors: Hartmut Enkisch, Aalen (DE); Sandro Hoffmann, Giengen (DE); Joern Weber, Aalen (DE); Sebastian Strobel, Aalen (DE); Mirko Ribow, Oberkochen (DE); Christoph Nottbohm, Ulm (DE); Matthias Sturm, Waiblingen (DE); Michael Krause, Ulm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 447 days.

(21) Appl. No.: 18/087,262

(22) Filed: Dec. 22, 2022

(65) Prior Publication Data

US 2023/0126018 A1    Apr. 27, 2023

Related U.S. Application Data

(63) Continuation of application No. PCT/EP2021/065352, filed on Jun. 8, 2021.

(30) Foreign Application Priority Data

Jun. 24, 2020 (DE) .............. 10 2020 207 807.6

(51) Int. Cl.
*G21K 1/06* (2006.01)
*G02B 1/12* (2006.01)
(Continued)

(52) U.S. Cl.
CPC .............. *G21K 1/062* (2013.01); *G02B 1/12* (2013.01); *G02B 5/208* (2013.01);
(Continued)

(58) Field of Classification Search
CPC .... G21K 1/062; G21K 2201/064; G02B 1/12; G02B 5/208; G02B 5/0891; G02B 5/1857; G02B 2207/107; G03F 7/70175
See application file for complete search history.

(56) References Cited

U.S. PATENT DOCUMENTS 6,707,602 B2 * 3/2004 Goldstein ........... G03F 7/70158
359/359
6,859,515 B2   2/2005 Schultz et al.
(Continued)

FOREIGN PATENT DOCUMENTS

DE         60312871 T2    12/2007
DE      102018220629 A1    6/2020
(Continued)

OTHER PUBLICATIONS

International Search Report, PCT/EP2021/065352, Sep. 28, 2021, 4 pages.
(Continued)

*Primary Examiner* — Nicole M Ippolito
(74) *Attorney, Agent, or Firm* — Edell, Shapiro & Finnan, LLC (57) ABSTRACT

In a method for producing an optical element for an EUV projection exposure apparatus, a shaping layer ($22_1$) is applied onto a substrate (20) so as to have a surface roughness of at most 0.5 nm rms directly after the application of the shaping layer onto the substrate.

14 Claims, 4 Drawing Sheets

(51) Int. Cl.
 *G02B 5/08* (2006.01)
 *G02B 5/18* (2006.01)
 *G02B 5/20* (2006.01)
 *G03F 7/00* (2006.01)

(52) U.S. Cl.
 CPC ........ *G03F 7/70175* (2013.01); *G02B 5/0891* (2013.01); *G02B 5/1857* (2013.01); *G02B 2207/107* (2013.01); *G21K 2201/064* (2013.01)

(56) References Cited

U.S. PATENT DOCUMENTS

| | | |
|---|---|---|
| 2014/0131586 A1 | 5/2014 | Wang et al. |
| 2018/0246414 A1 | 8/2018 | Banine et al. |
| 2020/0192009 A1* | 6/2020 | Evans ................. H01L 21/3065 |

FOREIGN PATENT DOCUMENTS

| | | |
|---|---|---|
| EP | 1225481 A2 | 7/2002 |
| WO | 2013113537 A2 | 8/2013 |

OTHER PUBLICATIONS

German Examination Report with English translation, Application No. 10 2020 207 807.6, Jan. 1, 2021, 10 pages.

\* cited by examiner

OPTICAL ELEMENT FOR A EUV PROJECTION EXPOSURE SYSTEM

CROSS REFERENCE TO RELATED APPLICATIONS

This is a Continuation of International Application PCT/EP2021/065352 which has an international filing date Jun. 8, 2021, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2020 207 807.6 filed on Jun. 24, 2020.

FIELD OF THE INVENTION

The invention relates to an optical element for an extreme ultraviolet (EUV) projection exposure apparatus. The invention also relates to a collector with such an optical element and to an intermediate product for producing such an optical element. Furthermore, the invention relates to a method for producing such an optical element.

BACKGROUND

In order to produce optical elements for an EUV projection exposure apparatus, provision may be made for a grating structure to be introduced into an etching layer. The production of such a grating structure with a defined step height is very complex. In addition, fluctuations in the step height of the grating structure and/or deviations of same from a specified value may occur.

SUMMARY

It is an object of the invention to improve an optical element for an EUV projection exposure apparatus.

This object is achieved in accordance with one formulation of the invention by:
  an optical element for an EUV projection exposure apparatus, having
  1.1. a substrate for specifying a curved basic topography,
  1.2. at least two shaping layers, applied on the substrate, with a layer thickness (D1(s)) according to a specified layer thickness profile (D1v(s)),
  1.3. a plurality of etch stop layers,
  1.4. an EUV radiation-reflecting layer,
  1.5. wherein at least one of the shaping layers is structured to form a grating structure with a bottom region, a front side, and a flank,
  1.6. wherein a transition from the bottom region to the flank has a radius of curvature of at most 5 µm, and
  1.7. wherein the EUV-radiation-reflecting layer is applied at least to the bottom region and to the front side of the grating structure.

One aspect of the invention consists in designing the optical element with a shaping layer, wherein the shaping layer is structured to form a grating structure in such a way that a transition from a bottom region to a flank is formed with sharp edges. In particular, rounding at the transition from the bottom region to the flank can be avoided.

In this case, the shaping layer can define the position of a front side and of a bottom region of the grating structure, in particular the relative position of the front side and of the bottom region of the grating structure. In particular, it can define, in particular specify precisely, the step height or the step heights of the grating structure. The properties of the grating structure are defined in particular with a specified layer thickness profile.

In particular, the front side and the bottom region run parallel to each other. This applies at least approximately, in particular at least locally, in particular in the case of a curved basic topography of the substrate.

It was recognized that the precision of the grating structure can be improved in this way. This leads to improved optical properties of the optical element, in particular to a higher reflectivity in the desired wavelength range and/or to a reduced reflectivity in undesired wavelength ranges.

The grating structure is also referred to as a trench structure or as a stepped structure. It can be a single-step structure with a front side and a bottom region but no intermediate steps, or it can be a two-step or multi-step structure with one or more intermediate steps.

The sharp-edged transition from the bottom region to the flank can be characterized in particular by its radius of curvature rB. This radius of curvature rB is in particular at most 5 µm, in particular at most 3 µm, in particular at most 2 µm, in particular at most 1 µm, in particular at most 0.5 µm. Such a sharp-edged transition cannot be achieved with conventional methods.

According to a further aspect of the invention, the transition from the front side to the flank is formed with sharp edges. The sharp-edged transition from the front side to the flank can be characterized in particular by its radius of curvature rV. This radius of curvature rV is in particular at most 5 m, in particular at most 3 µm, in particular at most 2 µm, in particular at most 1 µm, in particular at most 0.5 sm.

In particular, rounding of an edge at the transition from the front side to the flank, as can be observed after polishing steps, can be avoided.

It is also possible for a plurality of shaping layers to be applied to the substrate.

The shaping layers can be used in particular as etching layers. They are therefore also referred to as etching layers.

According to one aspect of the invention, the layer thicknesses each have a maximum deviation from the specified layer thickness profiles of at most 50 nm, in particular at most 30 nm, in particular at most 20 nm, in particular at most 10 nm. The maximum deviation of the layer thicknesses from the specified layer thickness profiles is in particular at most 2%, in particular at most 1%, in particular at most 0.5%, in particular at most 0.3%, in particular at most 0.2%, in particular at most 0.1%.

The actual thickness of the shaping layers thus corresponds very precisely to the specified profile. In particular, it can be specified and actually achieved much more precisely than with conventional polishing and etching methods.

The layer thickness of one or more, in particular all, of the shaping layers is in particular at least 1 µm, in particular at least 3 µm, in particular at least 5 µm. Said thickness is in particular at most 50 µm, in particular at most 30 µm, in particular at most 20 µm, in particular at most 10 µm. The layer thickness can in particular lie in the range from 3 µm to 7 µm.

This is advantageous in particular for a grating structure for filtering, in particular for suppressing, infrared radiation.

The optical element serves in particular as an infrared-suppressing EUV mirror. In other words, it forms a reflective IR filter.

Due to the precision of the layer thicknesses, the precision of the step heights of the grating structure of the optical element can be improved or any possible step depth errors can be reduced.

This can result in improved IR suppression.

A grating structure for filtering VUV radiation is likewise possible. In general, the thickness of the shaping layer for suppressing radiation having a specific wavelength is precisely an odd multiple of a quarter of the wavelength to be suppressed.

The shaping layers and the etch stop layer, which will be described below, are applied onto a substrate which defines a basic topography of the optical element. In particular, the substrate can define a curved basic topography. In particular, it can define an ellipsoidal or a paraboloidal basic topography. Practically any substrate shapes are possible, in particular also non-spherical shapes, for example free-form shapes. Planar shapes are also possible.

In the case of non-spherical substrates in particular, advantages result from the shaping layer which also serves as a shape-retaining layer. First, there is no need to adapt an etching rate to an etching position in order to structure the shaping layer, and second, locally different step depths can be achieved.

The shaping and/or shape-retaining layers have a layer thickness according to a specified layer thickness profile. The layer thickness can vary in particular over the surface of the optical element. In particular, it can depend on a position s on the surface of the optical element.

The shaping layers can in particular have an amorphous structure. In particular, they can be made of an etchable material. They can be made of amorphous silicon, for example. They can also be at least partially, in particular completely, silicon, germanium, carbon, boron, titanium, zirconium, niobium, tantalum, tungsten, vanadium, their alloys and compounds, in particular oxides, carbides, borides, nitrides and silicides, and mixed compounds, precious metals from the group ruthenium, rhodium, palladium, platinum, iridium, osmium, rhenium and their alloys.

The shaping layers are, in particular, made of a material that can be applied using a shape-preserving and/or roughness-preserving or smoothing method, for example a sputtering method, in particular with a magnetron sputtering method (MSD, magnetron sputter deposition), a physical or chemical vapor deposition method (PVD, CVD, in particular plasma-enhanced, PECVD), an atomic layer deposition method (ALD method), a pulsed laser deposition method (PLD method), an ion beam sputtering method, an electron beam evaporation method.

In particular, it can be a material that cannot be polished using conventional methods. In particular, it can be a material that cannot be polished to a maximum roughness of at most 0.5 nm rms.

According to a further aspect of the invention, the bottom region of the grating structure and/or the front side of the grating structure each have a surface roughness of at most 0.5 nm rms, in particular at most 0.3 nm rms, in particular at most 0.2 nm rms, in particular at most 0.15 nm rms. These details relate to the high spatial frequency roughness (HSFR), especially for spatial frequencies of more than 1 $\mu m^{-1}$.

All of the layers applied to the substrate, in particular the shaping layers and/or the etch stop layers to be described below, preferably have such a low roughness.

This leads to a reduction in stray light losses.

The bottom region can in particular have a surface roughness which deviates from the surface roughness of the front side by a maximum of 20%, in particular a maximum of 10%, in particular a maximum of 5%, in particular a maximum of 3%, in particular a maximum of 2%, in particular a maximum of 1%.

As a result, the reflectivity of the bottom region, in particular for EUV radiation, can be improved.

According to a further aspect, the optical element has an etch stop layer. The etch stop layer is arranged in particular between a shaping layer and the substrate. In this case, it can be arranged between two shaping layers. In the case of a layer stack with a plurality of shaping layers, an etch stop layer can be arranged between the shaping layer and the substrate, in particular adjoining thereto for each shaping layer.

The step height or, in the case of a multi-step grating, the step heights can be defined in a simple manner through the etch stop layers.

In particular, the etch stop layer has a thickness of the order of nm. The thickness of the etch stop layer can in particular be at most 50 nm, in particular at most 30 nm, in particular at most 20 nm, in particular at most 10 nm. The thickness of the etch stop layer is preferably as small as possible. On the other hand, it is large enough to reliably serve as an etch stop.

The etch stop layer is in particular made of a different material than the associated shaping layer. In particular, it is made of a material which, for a given etching method, has an etching rate that is lower by a factor of at least 10 than the shaping layer.

This leads to a high etch selectivity. This enables selective etching of the shaping layer.

The etch stop layer can, for example, be made of aluminum oxide, cerium oxide, yttrium oxide, chromium oxide, tantalum oxide, niobium oxide, tantalum oxide, titanium oxide, tungsten oxide, zirconium oxide, vanadium oxide and mixed oxides, noble metals from the group ruthenium, rhodium, palladium, platinum, iridium, osmium, rhenium and their alloys. Using a fluorine-based etchant, fluorides such as magnesium fluoride, lanthanum fluoride, cerium fluoride, yttrium fluoride, and ytterbium fluoride can also be used.

The etch stop layer is in particular made of a material with a sufficiently high etch selectivity in relation to the process used for structuring the shaping layers.

According to a further aspect of the invention, a further etch stop layer is arranged between the substrate and the lowermost shaping layer. This further etch stop layer can be advantageous during the production of the grating structure, in particular during the etching processes provided for this purpose for protecting the substrate. In principle, the substrate itself can also serve as the lowermost etch stop layer or replace it.

According to a further aspect of the invention, the shaping layers are structured to form a two-step or multi-step grating structure with two or more step heights, wherein the step heights are defined by the layer thicknesses of the shaping layers.

A two-step grating structure is equivalent here to a grating structure with three levels.

In this case, an etch stop layer can be arranged in each case between two shaping layers.

According to a further aspect of the invention, the layer thicknesses over the surface of the optical element have a maximum fluctuation of at most 50 nm, in particular at most 30 nm, in particular at most 20 nm, in particular at most 10 nm. In the case of a VUV filter, the maximum fluctuations are correspondingly lower.

In this case, the difference between the maximum layer thickness and the minimum layer thickness measured in the direction perpendicular to the surface of the substrate is referred to as the fluctuation.

The shaping layers and/or the etch stop layers have, in particular, a homogeneous, i.e. a constant, layer thickness.

As a result, the process control during the production of the optical element can be improved. In addition, the production can be simplified as a result. In particular, a simultaneous penetration of the etch stop layer can be made possible.

According to a further aspect, the shaping layer can have a nanolaminate or consist of a nanolaminate.

It has been found that this leads to the shaping layer being able to be smoothed particularly well.

The shaping layer can in particular be formed as an etch stack, in particular as a monolithic etch stack.

According to a further aspect, a proportion of the area of the flank in a top view is at most 2%, in particular at most 1%, in particular at most 0.5%, in particular at most 0.3%, in particular at most 0.2%, in particular at most 0.1% of the total surface area of the optical element, in particular the entirety of the surface areas of the front side and of the bottom region.

The flanks form a loss region for the transmission of the EUV radiation in a specific, specified direction. According to the invention, the proportion of the area of this loss region can be significantly reduced.

According to one aspect of the invention, the optical element is used as a spectral filter, in particular for suppressing radiation having a wavelength of more than 100 nm, in particular for suppressing IR and/or VUV radiation.

The optical element can in particular be an integral part of a collector for an EUV projection exposure apparatus. With a collector of this type, suppression of IR radiation is particularly advantageous. A collector with IR suppression reduces the heating of the downstream optical elements.

The collector may include an arrangement for dissipating heat. In particular, it can have one or more cooling structures or be connected to a cooling device.

The suppression of unwanted radiation (IR/VUV, . . ) at the first mirror of the entire EUV optical unit is advantageous because this allows more freedoms in the design (layer design and structure) of the downstream mirrors, since the suppressed radiation no longer has to be taken into account separately here.

Compared to downstream mirrors, the collector is particularly suitable for the introduction of etch stop layers and the production of suppression gratings, since the requirements relating to the far field and the wavefront (for EUV radiation) are comparatively lower for the collector, and higher manufacturing tolerances are therefore permitted.

A further object of the invention is to improve a method for producing an optical element, in particular an optical element according to the preceding description.

This object is achieved, in accordance with a further formulation of the invention, by a method comprising the following steps:
  providing a substrate with a basic topography,
  applying a shaping layer with a layer thickness according to a specified layer thickness profile onto the substrate, wherein the shaping layer has a surface roughness of at most 0.5 nm rms, in particular at most 0.3 nm rms, in particular at most 0.2 nm rms, in particular at most 0.15 nm rms directly after the application onto the substrate.

The fact that the shaping layer has such a low surface roughness directly after the application onto the substrate should mean that no smoothing methods, in particular no removal methods, are necessary to achieve such a low surface roughness. In particular, no post-treatment steps are necessary after the application of the shaping layer onto the substrate in order to reduce the surface roughness of the shaping layer.

In other words, the shaping layer is particularly smooth. This makes it possible to apply an EUV-reflecting layer directly onto the shaping layer. The otherwise usual polishing steps can be dispensed with. First, this leads to a considerable simplification of the method and, second, to the shaping layer having a predetermined thickness which is not reduced by any undefined polishing removal. With the method according to the invention it is possible in particular to produce the layers, in particular the shaping layers, directly, in particular in a single application step, with a precisely specified layer thickness, in particular a layer thickness which corresponds to the layer thickness of these layers in the finished product.

In particular a roughness-preserving, in particular a smoothing, layer can serve as the shaping layer. The shaping layer can be applied in particular in a roughness-preserving, in particular a smoothing, method.

This is understood to mean that the surface roughness of the shaping layer directly after the application onto a surface is at most as great, in particular less so, as the surface roughness of the surface onto which it is applied.

The method according to the invention serves in particular to produce an optical element with a grating structure, in particular a two-step grating structure, i.e. a 3-level grating. The method is used in particular to produce an optical element in accordance with the previous description.

For details relating to the shaping layer, in particular its thickness and/or the material of the shaping layer, reference is made to the previous description.

According to one aspect of the invention, the shaping layer is applied in such a way that its layer thickness deviates from a specified layer thickness by at most 1%, in particular at most 0.5%, in particular at most 0.3%, in particular at most 0.2%.

This makes it possible to specify, in particular to define, a trench depth of the grating structure, in particular its profile, directly when the substrate is coated with the shaping layer. The trench depth, i.e. the step height, and its profile can in particular be specified very precisely.

The precise specification of the layer thicknesses in combination with defined etch stop layers makes it possible to dispense with a complex process loop of repeated etching steps and subsequent depth measurements. This improves the precision of the grating structures produced and also considerably simplifies their production method.

The etch stop layer or the etch stop layers can be used to avoid etch trails that otherwise usually occur. Etch trails of this kind otherwise form at the transition between the bottom region and the flank. They lead to a rounding or deepening (so-called "trenching") of the transition. This increases the size of the loss region that cannot be used to reflect EUV radiation in the desired direction. The loss region can be reduced to less than 1%, in particular less than 0.5%, in particular less than 0.3%, in particular less than 0.2%, by the etch stop layer.

A polishable material or even a non-polishable material can be used as the material for the shaping layer.

According to a further aspect of the invention, a roughness-preserving, in particular a smoothing, method, for example a sputtering method, in particular a magnetron sputtering method (MSD, magnetron sputter deposition), a physical or chemical vapor deposition method (PVD, CVD, in particular a plasma-enhanced CVD, PECVD), an atomic layer deposition method (ALD method), a pulsed laser deposition method (PLD method), an ion beam sputtering method, or an electron beam evaporation method, is used for applying the shaping layer.

Such an application method enables a very precise application of the shaping layer, in particular an application of the shaping layer with a predetermined thickness, in particular a predetermined layer thickness profile.

According to one aspect of the invention, the method comprises exclusively roughness-preserving additive steps. This entails that all additive method steps are roughness-preserving, in particular smoothing. The method can also comprise selective structuring steps.

According to a further aspect of the invention, an etch stop layer is applied in each case under the shaping layer, in particular under each of the shaping layers.

The etch stop layer makes the structuring of the shaping layer simpler. In particular, it makes the etching process for producing a grating structure with a predetermined step height simpler. In the method according to the invention, the etching processes in particular do not have to be interrupted for a depth measurement, in particular for determining the trench depth and/or for determining a residual layer thickness of the shaping layer.

In particular, the etch stop layer makes it possible to precisely achieve the step height specified by the layer thickness of the shaping layer. It thus leads to increased precision of the grating structure and consequently to improved optical properties.

The etch stop layer can be grown in each case. For their thickness and possible materials, reference is made to the previous description.

In particular, an etch stop layer can be grown onto the substrate. An etch stop layer can also be grown onto a shaping layer.

The etch stop layer is applied in particular in a roughness-preserving, in particular in a smoothing, method.

According to one aspect of the invention, at least one shaping layer and at least one etch stop layer, in particular all shaping layers and all etch stop layers, are applied in one run, i.e. one after the other in the same apparatus, without interrupting the process, in particular the vacuum.

This considerably simplifies the application of the layer system made of shaping layers and etch stop layers. In particular, impurities and/or surface modifications, such as oxidation reactions, can be avoided.

The combination of shaping layers with a low surface roughness and one or more etch stop layers can greatly simplify the process chain.

If the substrate is made of a material which itself acts as an etch stop in the intended etching processes, a separate etch stop layer between the substrate and the lowermost shaping layer can be dispensed with. This is particularly the case if the substrate is made of the same material as the etch stop layer.

According to a further aspect of the invention, the shaping layer is structured in a two-step structuring step comprising a lithography step and a subsequent etching step. The etching step is, in particular, an etching step with a chemical component. The etching step is limited by the etch stop layer. Since the etch stop layer is insensitive to the etching process, over-etching may be realized to compensate for etch rate fluctuations.

According to a further aspect of the invention, at least two shaping layers are applied onto the substrate, which are each separated from one another by an etch stop layer. In particular, provision may be made for a layer system with an alternating sequence of etch stop layers and shaping layers to be applied onto the substrate. In particular, provision may be made for an etch stop layer, a shaping layer, a further etch stop layer, and a further shaping layer in this order to be applied onto the substrate. The layers each have the precision described above.

Preferably, a suitable etch stop layer is applied under each shaping layer. This considerably simplifies the etching process.

According to a further aspect of the invention, the method exclusively comprises additive steps and structuring steps, in particular selective structuring steps. In this context, selective structuring means local etching of an exposed surface in accordance with a previously produced etching mask. In particular, this etching mask can consist of a lithographed resist mask or an etch stop layer previously structured in this way. In both cases, the etching masks are distinguished by a high etching selectivity with respect to the materials of the shaping layers. Polishing steps can be entirely dispensed with.

In this way, a rounding of edges can be avoided.

According to a further aspect, the method enables the exclusive use of dry method steps. In particular, it can be free of wet-chemical method steps.

In particular, the method can exclusively include additive method steps, for example application and/or deposition steps, and etching method steps, in particular chemical and/or physical etching method steps. Unspecific removal steps can be dispensed with. In particular, the production method does not require any non-selective, mechanical removal steps at all. This enables the production of a layer structure with a precisely specified layer thickness or a precisely specified layer thickness profile. Overall, this leads to a considerable simplification of the process chain and to an improved accuracy with regard to the etching depths. This leads in particular to improved suppression of unwanted radiation.

According to a further aspect of the invention, a radiation-reflecting layer is applied onto the respectively uppermost layer, in particular the respectively uppermost shaping layer. The radiation-reflecting layer can in particular be applied directly onto the uppermost shaping layer. The radiation-reflecting layer is in particular an EUV-radiation-reflecting layer. In particular, it can be a layer stack made of molybdenum-silicon double layers.

BRIEF DESCRIPTION OF THE DRAWINGS

Further details and advantages of the invention will become apparent from the description of exemplary embodiments with reference to the figures. The figures show in:

FIG. 1 schematically a meridional section through a projection exposure apparatus for EUV projection lithography, FIGS. 2A to 2E schematic details from a cross section through an optical element with a two-step grating structure at different stages in the production process, specifically an intermediate product provided for a first structuring step (FIG. 2A), following a first structuring step (FIG. 2B), following a physical etching step (FIG. 2C), following a second structuring step (FIG. 2D), and following application of a radiation-reflecting layer (FIG. 2E).

DETAILED DESCRIPTION

Firstly, the general construction of a microlithographic projection exposure apparatus 1 will be described.

Figure 1:
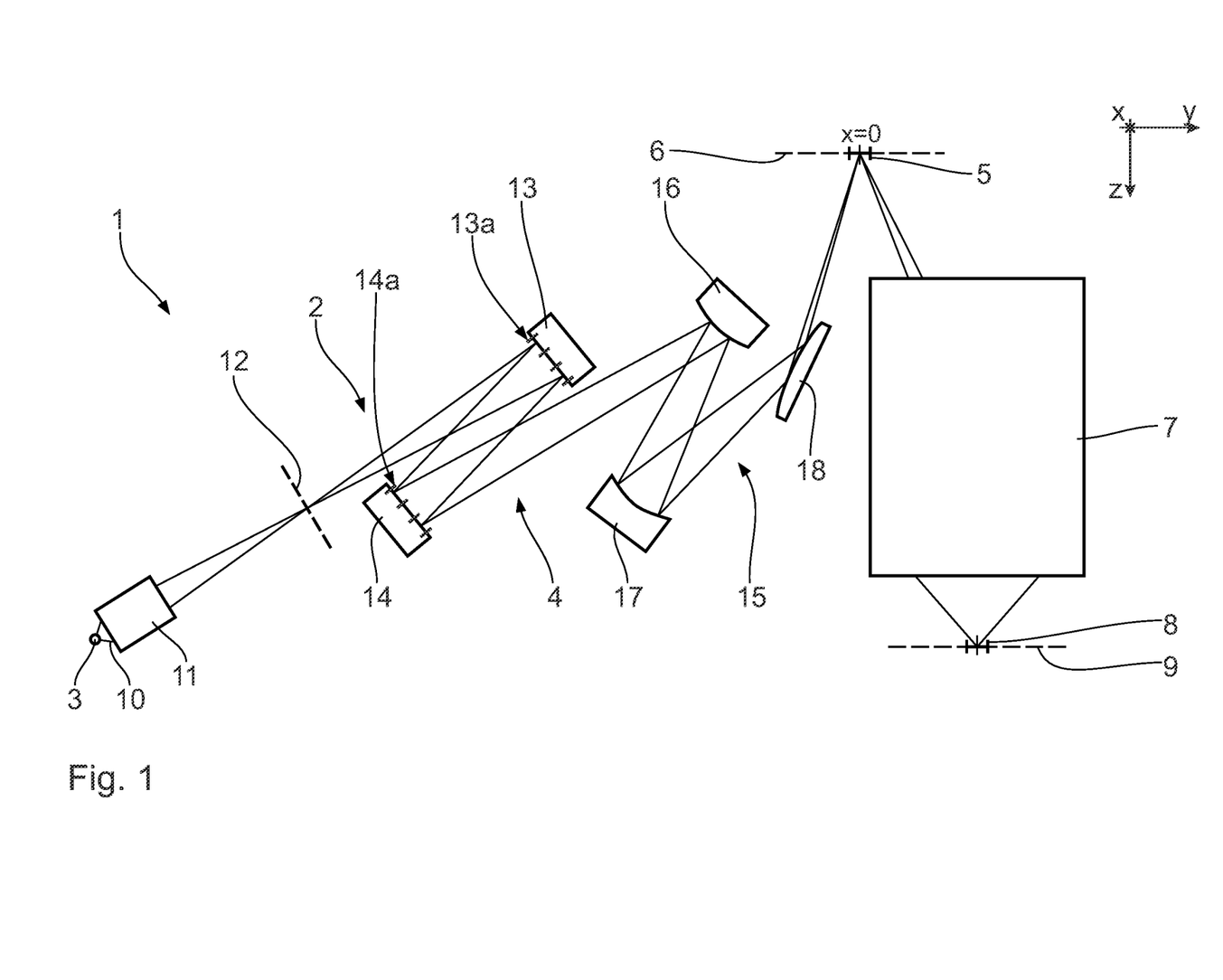

FIG. 1 schematically shows a microlithographic projection exposure apparatus 1 in a meridional section. An illumination system 2 of the projection exposure apparatus 1 has, besides a radiation source 3, an illumination optical unit 4 for the exposure of an object field 5 in an object plane 6. In this case, a reticle (not illustrated in the drawing) that is arranged in the object field 5 and is held by a reticle holder (likewise not illustrated) is exposed. A projection optical unit 7 serves for imaging the object field 5 into an image field 8 in an image plane 9. A structure on the reticle is imaged onto a light-sensitive layer of a wafer (likewise not illustrated in the drawing) that is arranged in the region of the image field 8 in the image plane 9 and is held by a wafer holder (likewise not illustrated).

The radiation source 3 is an EUV radiation source with emitted used radiation in the range of between 5 nm and 30 nm. This may be a plasma source, for example a GDPP (gas discharge-produced plasma) source or an LPP (laser-produced plasma) source. By way of example, tin can be excited to form a plasma using a carbon dioxide laser operating at a wavelength of 10.6 μm, that is to say in the infrared range. A radiation source based on a synchrotron can also be used for the radiation source 3. Information about such a radiation source can be found by a person skilled in the art for example in U.S. Pat. No. 6,859,515 B2. EUV radiation 10 emerging from the radiation source 3 is focused by a collector 11. A corresponding collector is known from EP 1 225 481 A. Downstream of the collector 11, the EUV radiation 10 propagates through an intermediate focal plane 12 before being incident on a field facet mirror 13 with a multiplicity of field facets 13a. The field facet mirror 13 is arranged in a plane of the illumination optical unit 4 which is optically conjugate with respect to the object plane 6.

The EUV radiation 10 is also referred to hereinafter as illumination light or as imaging light.

Downstream of the field facet mirror 13, the EUV radiation 10 is reflected by a pupil facet mirror 14 with a multiplicity of pupil facets 14a. The pupil facet mirror 14 is arranged in a pupil plane of the illumination optical unit 4, which is optically conjugate with respect to a pupil plane of the projection optical unit 7. With the aid of the pupil facet mirror 14 and an imaging optical assembly in the form of a transfer optical unit 15 with mirrors 16, 17 and 18 designated in the order of the beam path, individual field facets 19, which are also referred to as subfields or as individual mirror groups, of the field facet mirror 13 are imaged into the object field 5. The last mirror 18 of the transfer optical unit 15 is a grazing incidence mirror.

With the aid of the projection exposure apparatus 1, at least one part of the reticle in the object field 5 is imaged onto a region of a light-sensitive layer on the wafer in the image field 8 for the lithographic production of a microstructured or nanostructured component, in particular of a semiconductor component, for example of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

A method for producing an optical element of the projection exposure apparatus 1 and intermediate products in the production of this optical element are described below with reference to FIGS. 2A to 2E and FIG. 3.

The optical element can in particular be a mirror, in particular a mirror of the illumination optical unit 4 or the projection optical unit 7. In particular, it can be a mirror of the collector 11. It can also be a spectral filter, in particular a filter for suppressing infrared radiation (IR radiation). In particular, it is an EUV-reflecting mirror with an IR-suppressing effect. For further details of such an optical element, reference is made by way of example to PCT/EP 2019/082 407, which is incorporated herein by reference in its entirety.

Figure 3:
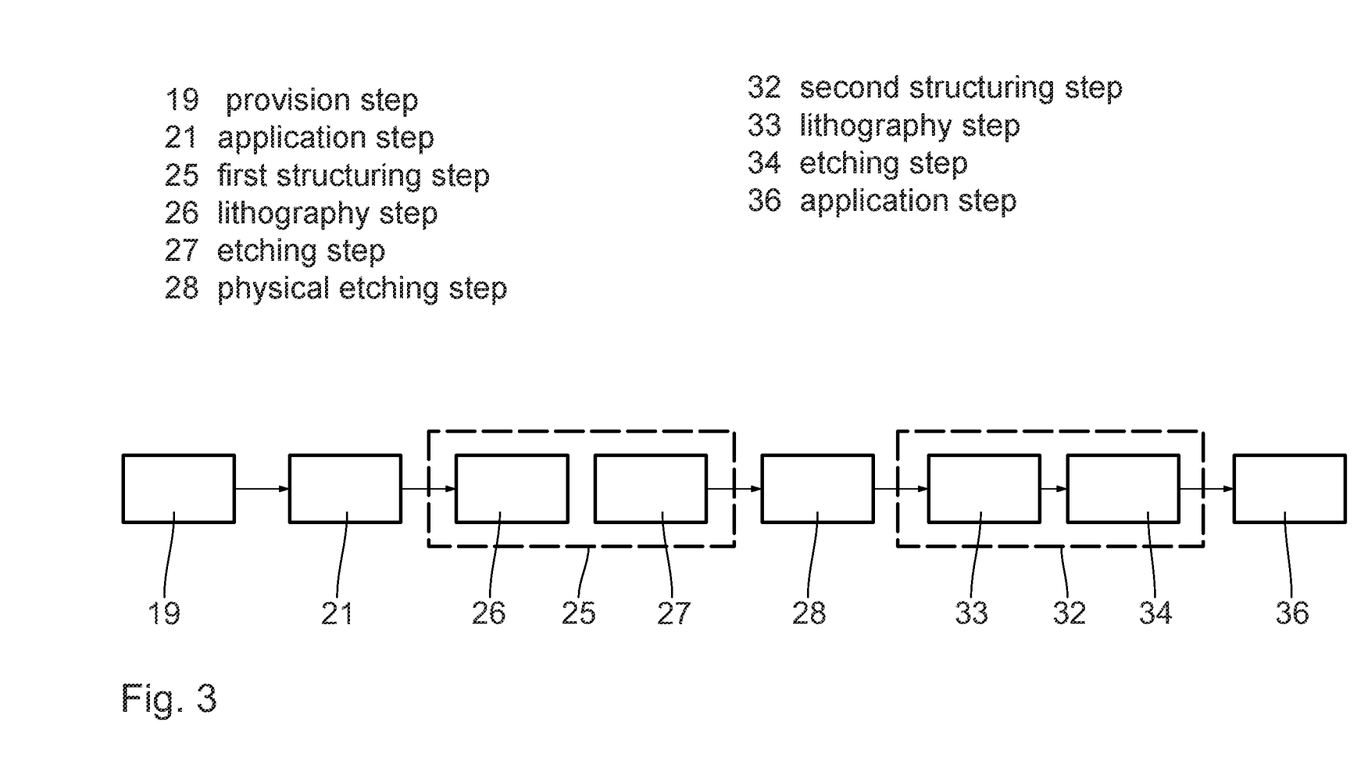
FIG. 3 schematically a sequence of process steps from the process chain for producing the optical element, and FIG. 4 schematically a detail through a cross section of an intermediate product for the production of a collector mirror.

First, a substrate 20 is provided in a provision step 19. The substrate 20 is used to specify a basic topography of the optical element. In particular, it can have a non-planar, i.e. a curved, surface, such as e.g., a convex or concave surface. The substrate can have an aspheric, in particular an ellipsoidal, or a paraboloidal basic topography.

In an application step 21, a sequence of etching layers $22_i$ ($i \geq 1$) and etch stop layers $23_i$ ($i \geq 1$) is applied to the substrate 20.

The etching layers $22_i$ are applied in particular through a deposition method, in particular through a sputtering method, such as a magnetron sputtering method (MSD, magnetron sputter deposition).

The etch stop layers $23_i$ are in particular grown.

The etching layers $22_i$ are applied with a thickness $D_i$. The layer thickness $D_i$ can vary over the surface of the substrate 20, $D_i = D_{i(s)}$, where s denotes the position on the surface of the substrate 20. The etching layer $22_i$ is applied onto the substrate 20 in particular with a layer thickness $D_{i(s)}$ according to a specified layer thickness profile $D_{iv(s)}$.

The layer thickness $D_{i(s)}$ deviates, in particular in the region of the entire surface of the substrate 20, by at most 1% from the specified layer thickness $D_{iv(s)}$.

The etching layers $22_i$ have a smooth surface. Their surface roughness is in particular 0.15 nm rms. This specification refers in particular to the range of high spatial frequencies, in particular of at least 1/μm.

The etching layers $22_i$ have in particular a thickness $D_i$ of a few μm. The thickness $D_i$ of the etching layers $22_i$ can in particular lie in the range from 1 μm to 10 μm, in particular in the range from 3 μm to 7 μm.

The overall thickness of the coating of the substrate 20, in particular the sum of the thickness of all the etching layers $22_i$ and etch stop layers $23_i$, is in particular at most 20 μm, in particular at most 10 μm. These details should not be understood as limiting.

The etching layers $22_i$ can be made, for example, of amorphous silicon, $SiO_2$ or $Si_3N_4$.

Their thickness $D_i$ is set directly during coating. The thickness $D_i$ can in particular be set with an accuracy of better than 1%, in particular better than 0.5%, in particular better than 0.3%, in particular better than 0.2%.

The etch stop layers $23_i$ are made of a material with a selectivity for the intended etching process. The etch stop layers $23_i$ can, for example, be made of ruthenium or aluminum oxide ($Al_2O_3$).

The etch stop layers $23_i$ can be in particular grown, particularly grown smoothly. They have a thickness D in the range of a few nm, in particular in the range from 1 nm to 20 nm, in particular in the range from 3 nm to 10 nm. In particular, they have a maximum surface roughness which corresponds to the surface roughness of the etching layers $22_i$.

The shaping etching layers $22_i$ and the etch stop layers $23_i$ are applied in particular with a roughness-preserving, in particular a smoothing, process.

They are applied with great precision. The maximum thickness deviation over the optically used surface area of the optical component is in particular at most 2%, in particular at most 1%, in particular at most 0.5%, in particular at most 0.3%, in particular at most 0.2%. In the event of a layer thickness of the etching layer $22_i$ in the range of a few micrometers, the maximum thickness deviation can be in particular at most 50 nm, in particular at most 30 nm, in particular at most 20 nm, in particular at most 10 nm. The etching layers $22_i$ are therefore also referred to as shape-retaining or shaping layers.

The term shape-retaining layer is used in particular if the layer has a constant thickness. Layers of varying thickness are referred to as shaping layers.

Figure 4:
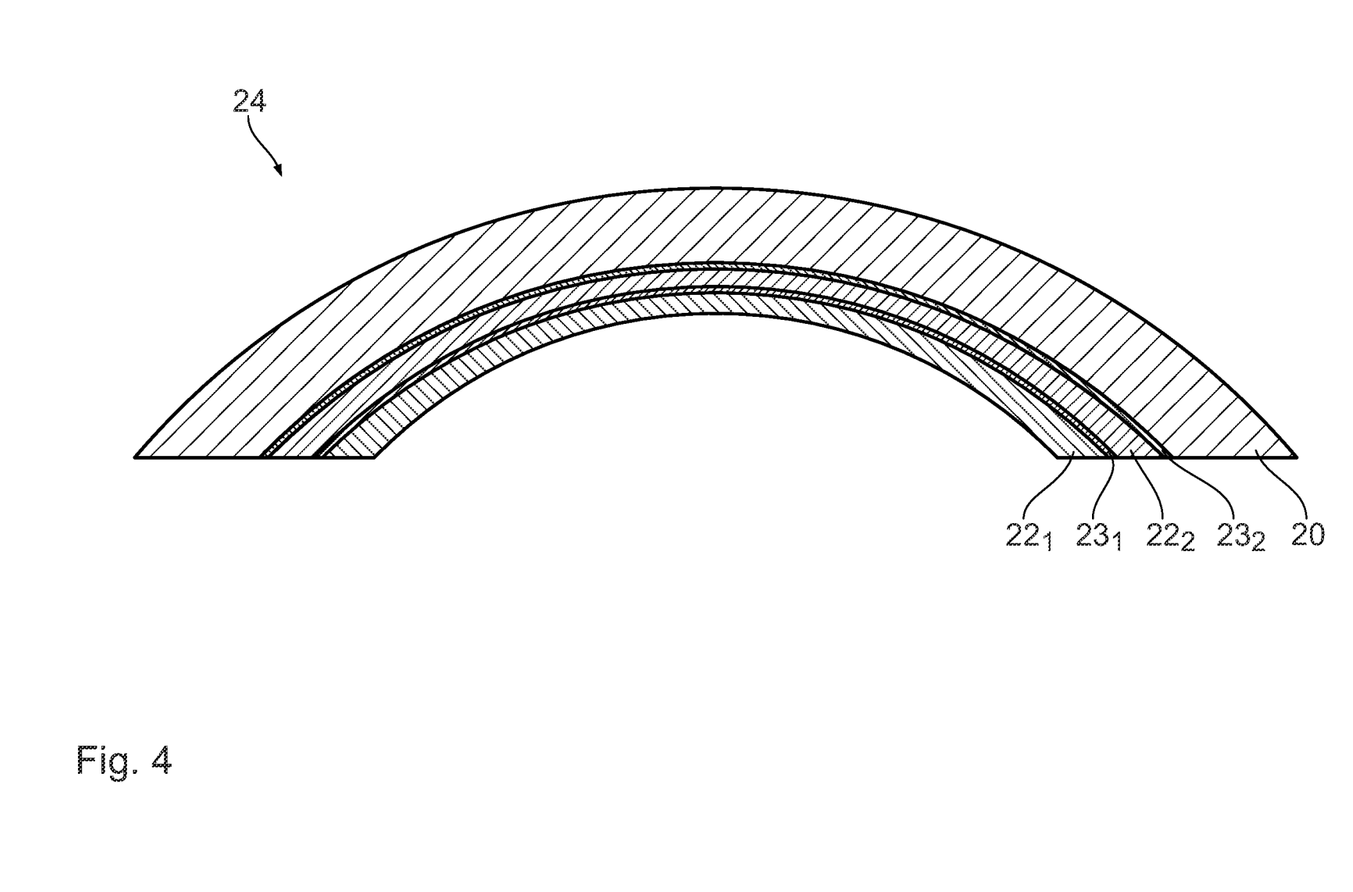

After applying all the etching layers $22_i$ and etch stop layers $23_i$ onto the substrate 20, an intermediate product 24 for producing the optical element is present. FIG. 4 shows an example of an intermediate product 24 for producing a collector shell. In this case, the substrate 20 has a curved surface, in particular an ellipsoidal or a paraboloidal surface.

Figure 2A:
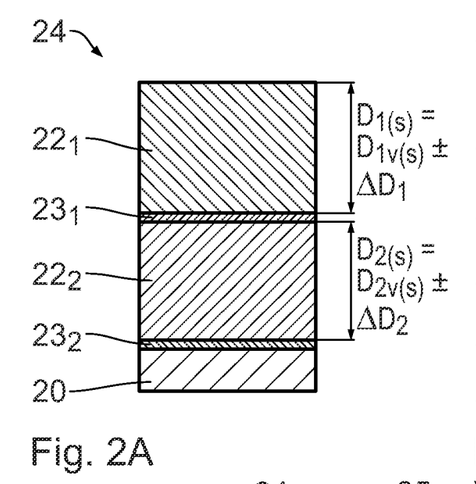

In a first structuring step 25, the uppermost etching layer $22_1$ is structured. A lithography step 26 and a subsequent etching step 27 are provided for this purpose. Since the etching depth is limited by the etch stop layer $23_1$, the demands relating to the etching process are significantly reduced. In particular, it is permissible to over-etch during the etching step 27 without running the risk in the process of removing too much material.

Figure 2B:
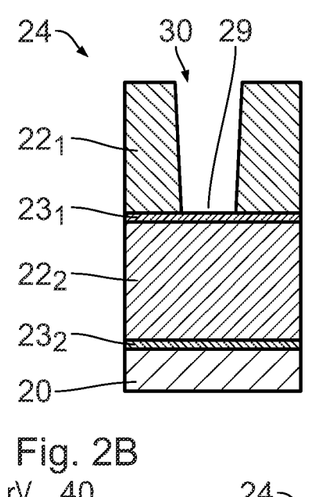

The intermediate product 24 is shown in FIG. 2B at the stage after the first structuring step 25.

For selective opening, i.e. for selective, region-by-region removal of the etch stop layer $23_1$, a physical etching step 28, in particular a dry etching process step, is provided.

In particular, reactive ion etching can serve as the etching step 28. It can include reactive (chemical) and sputtering (physical) components. The etching step 28 is, in particular, a directional, anisotropic process. In this way, it can be ensured that an overlying etch stop layer is not flushed from underneath in a second etching step.

Here, the etch stop layer $23_1$ is selectively removed in the bottom region 29 of the first trench structure 30 produced in the first structuring step 25. Here, sections of the bottom region 29 are left standing in order to subsequently form steps 31.

For further details of the structuring step, reference is made to DE 10 2018 220 629.5.

Figure 2C:
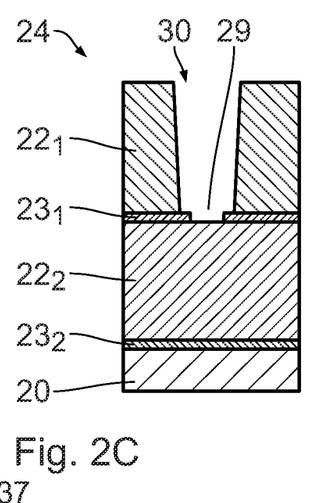

In FIG. 2C, the intermediate product 24 is shown as an example after the physical etching step 28 has been completed.

Then, in a second structuring step 32, the second etching layer 222 is structured. The second structuring step 32 comprises a lithography step 33 and an etching step 34 corresponding to the first structuring step 25. For details of the second structuring step 32, reference is made to the description of the first structuring step 25. The structuring steps 25, 32 can be substantially identical. They can also differ in one or more details. This is provided in particular if the etching layers $22_1$, 222 are not identical in design.

Figure 2D:
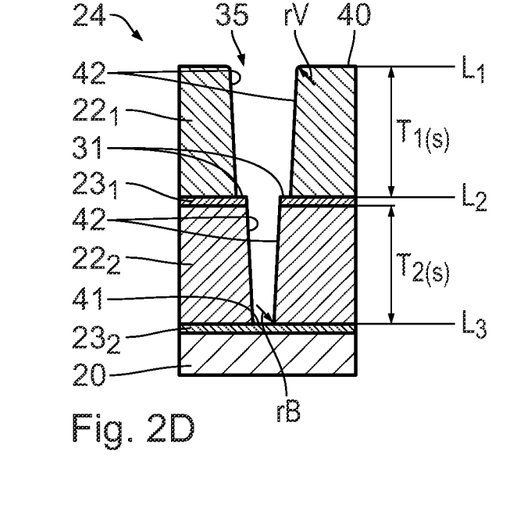

FIG. 2D shows by way of example the state of the intermediate product 24 after the second structuring step 32. The intermediate product 24 now has a two-step trench structure 35, i.e. a structure with three levels $L_1, L_2, L_3$.

The uppermost or frontmost level $L_1$ forms a front side 40 of the trench structure 35.

The trench structure 35 also has a bottom region 41.

Finally, the trench structure 35 has flanks 42.

In the example shown in FIG. 2D, the trench structure 35 has an intermediate step, namely the step 31. It is therefore a two-step grating structure.

This is to be understood to be an example. With the method described above, one-step or multi-step, in particular three-step or four-step grating structures can also correspondingly be produced.

The transition from the bottom region 41 to the flank 42 is sharp-edged. It has a radius of curvature rB of at most 5 μm, in particular at most 3 μm, in particular at most 2 μm, in particular at most 1 μm.

The transition from the front side 40 to the flank 42 is sharp-edged. In particular, it has a radius of curvature rV of at most 5 μm, in particular at most 3 μm, in particular at most 2 μm, in particular at most 1 μm.

The flanks 42 form a loss region. In particular, they do not contribute to the transmission of the EUV radiation in the direction specified by the front side 40 and the bottom region 41. It is therefore advantageous for the flanks 42 to be as steep as possible. The angle between one of the flanks 42 and a surface normal to the bottom region 41 and/or to the front side 40 is preferably at most 15°, in particular at most 10°, in particular at most 5°, in particular at most 3°, in particular at most 2°, in particular at most 1°.

Figure 2E:
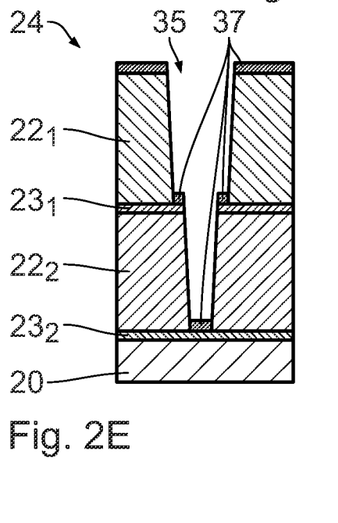

In a subsequent application step 36, a radiation-reflecting layer 37 is applied. The radiation-reflecting layer 37 is applied in particular to all three levels $L_1, L_2, L_3$.

The radiation-reflecting layer 37 is in particular an EUV radiation-reflecting layer. The radiation-reflecting layer 37 is in particular a layer stack made of molybdenum-silicon double layers.

Between the radiation-reflecting layer 37 and the shaping etching layer $22_i$ there may be further possible layers. In particular, protective layers or other functional layers can be applied onto the etching layers $22_i$, in particular onto the uppermost of the etching layers $22_1$.

The radiation-reflecting layer 37 is applied directly onto the layers $22_1$, $23_1$ and 232. Due to the low surface roughness of these layers, a preceding polishing step can be dispensed with.

In principle, the uppermost etching layer $22_i$ can also be polished.

The intermediate product 24 with the radiation-reflecting layer 37 is shown schematically in FIG. 2E.

The method described above leads to advantages in particular with regard to integral parts of the collector 11, in particular collector shells. In particular, this makes it possible to produce a collector 11 with improved IR suppression. This is due to a reduction in the step depth error. At the same time, the method according to the invention leads to a considerable simplification of the process chain, in particular to a reduction in throughput time. This is due to the bypassing of polishing steps and of the ability to omit the etch depth determination.

In the following text, different aspects of the invention are described again in the form of keywords. These aspects lead in each case to advantages individually or in combination.

A shape-retaining or a shaping method is used to deposit the etching layers $22_i$. The etching layers $22_i$ are therefore also referred to as shaping layers.

A deposition method, in particular a roughness-preserving, preferably a smoothing, deposition method is used in particular to apply the shaping layers. The layers thus have a specified layer thickness profile and a very low surface roughness immediately after their application.

Each coating step can comprise at least one of the following elementary processes: separation, removal and smoothing. These elementary processes can take place sequentially or simultaneously.

Each of these elementary processes can act globally, in particular on the entire optically used surface of the optical element, or locally, selectively.

Smoothing can take place before coating, during coating and/or after coating.

An ion beam method, in particular a reactive ion beam method, a plasma method, in particular a reactive plasma method, a plasma jet method, a remote plasma method, atomic layer etching, in particular spatial atomic layer etching, electron beam-assisted etching or another method can be used, in particular to remove and/or smooth them for selectively removing individual regions of the etching layers $22_i$ and/or of the etch stop layers $23_i$. Spatial atomic layer processing or processing with a focused electron beam can also be provided.

The use of nanolaminates can be advantageous for a particularly low surface roughness. These layers of alternating material combinations, which are a few nanometers thick, can be smoothed using the methods mentioned above, although smoothing the pure volume material would actually not be possible due to their hardness. For example, tantalum carbide (TaC), which is a very hard material, can be smoothed in this way.

What is claimed is:

1. An optical element for an extreme ultraviolet (EUV) projection exposure apparatus, comprising:
   a substrate specifying a curved basic topography,
   at least two shaping layers, applied onto the substrate, each with a layer thickness ($D_i(s)$) according to a specified layer thickness profile (Div(s)),
   a plurality of etch stop layers,
   an EUV radiation-reflecting layer,
   wherein at least one of the shaping layers is structured to form a grating structure with a bottom region, a front side, and a flank,
   wherein a transition from the bottom region to the flank has a radius of curvature of at most 5 μm, and
   wherein the EUV-radiation-reflecting layer is applied at least to the bottom region and to the front side of the grating structure.

2. The optical element as claimed in claim 1, wherein the etch stop layers and the shaping layers are applied to the substrate in an alternating sequence.

3. The optical element as claimed in claim 1, wherein the layer thickness ($D_i$) in each case has a maximum deviation of at most 50 nm from a specified layer thickness (Dvi).

4. The optical element as claimed in claim 1, wherein the bottom region has a surface roughness of at most 0.5 nm rms.

5. The optical element as claimed in claim 1, wherein the bottom region has a surface roughness which is at most 20% greater than a surface roughness of the front side.

6. The optical element as claimed in claim 1, wherein at least one of the etch stop layers is arranged between the substrate and at least one of the shaping layers.

7. The optical element as claimed in claim 1, wherein a proportion of an area of the flank in a top view of the optical element is at most 2% of a total surface area in the top view of the optical element.

8. The optical element as claimed in claim 1, wherein at least one of the shaping layers comprises a nanolaminate.

9. The optical element as claimed in claim 1 and configured as a spectral filter.

10. A method for producing an optical element for an extreme ultraviolet (EUV) projection exposure apparatus, comprising:
    providing a substrate with a basic topography,
    applying a shaping layer onto the substrate with a layer thickness ($D_i(s)$) according to a specified layer thickness profile (Div(s)),
    applying an etch stop layer, wherein the etch stop layer is applied under the shaping layer,
    wherein the shaping layer has a surface roughness of at most 0.5 nm rms directly after said applying onto the substrate,
    wherein all of the layers are applied in vacuum conditions, wherein the vacuum is maintained between said applying of the shaping and the etch stop layers.

11. The method as claimed in claim 10, wherein said applying of the shaping layer is performed such that a layer thickness ($D_i$) of the shaping layer deviates by at most 1% from a layer thickness (Div) specified for the shaping element.

12. The method as claimed in claim 10, wherein said applying of the shaping layer comprises a roughness-preserving method or a smoothing method.

13. The method as claimed in claim 10, further comprising applying a further shaping layer onto the substrate such that the further shaping layer is separated from the applied shaping layer by a further etch stop layer.

14. The method as claimed in claim 10, wherein said applying steps comprise exclusively additive steps and selective structuring steps.

* * * * *